Jan. 12, 1960 J. P. ECKERT, JR., ET AL 2,921,193

VOLTAGE REGULATORS

Filed Sept. 21, 1956

INVENTORS
J.P. Eckert, Jr.
R.W. Spencer

BY [signature]
AGENT

United States Patent Office 2,921,193
Patented Jan. 12, 1960

2,921,193

VOLTAGE REGULATORS

John Presper Eckert, Jr., Gladwyne, and Richard W. Spencer, Philadelphia, Pa., assignors to Sperry Rand Corporation, New York, N.Y., a corporation of Delaware Application September 21, 1956, Serial No. 611,256
8 Claims. (Cl. 250—27)

The present invention relates to improved pulse type amplifiers, particularly those capable of utilization as square-wave generators; and is primarily concerned with novel arrangements for regulating the output amplitude of such amplifiers and generators in a more efficient manner than has been the case heretofore.

Pulse type amplifiers suggested heretofore have taken various configurations, but in general such amplifiers comprise at least one driver stage and an output stage coupled thereto. When such amplifiers are utilized in squarewave generation, the driver stage may in fact produce a squarewave voltage at a grid or control electrode of the output stage whereby the anode or output electrode of the output stage tends to describe a desired squarewave excursion. In practice it has been found that the actual voltage excursion present at the output electrode of such an amplifier output stage, for a given drive pulse coupled thereto, may in fact vary over wide limits depending upon the characteristics of the driver and output stages as well as upon possible variations in input signal and supply voltage. When these factors are accompanied by a load which may also be variable in nature, the overall output voltage regulation of the amplifier tends to become fairly poor. In order to obviate this undesired operating characteristic of known pulse type amplifiers, various voltage regulation schemes have been suggested, and these schemes have, in general, been characterized by the fact that they are relatively complex; and, in addition to appreciably decreasing the efficiency of the overall circuit, may in fact adversely affect the operation of the amplifier.

One particular such scheme suggested heretofore has contemplated the inclusion of a diode between the output and control electrodes of the output stage, e.g. the anode and control grid of the output stage when that stage takes the form of a vacuum tube. In operation, the diode regulator has included means biasing the diode whereby the diode conducts only after the output electrode or anode of the output stage falls, for instance, below a desired potential; and conduction of said diode in turn controls the control grid or control electrode potential of the said output stage in an attempt to regulate the overall output voltage of the amplifier.

Such diode regulators have been subject to the particular disadvantage that the anode to cathode capacitance of the regulating diodes appear as anode to grid capacitance in the amplifier output stages whereby diode regulators suggested heretofore impose a capacitive loading on the output driver stage of the amplifier. This driver stage loading occurs since the diode capacitance appears, at the driver, to be multiplied by the gain of the output stage, and this effect has required increased output power from the driver stages employed. It has also resulted in additional capacitive loading on the output stage, thus increasing output stage power dissipation.

The present invention serves to obviate the foregoing difficulties and disadvantages of voltage regulators suggested heretofore. In particular, the invention contemplates the provision of a grid controlled voltage regulator coupled between the output and control electrodes of an amplifier output stage thereby to improve appreciably the overall operation of voltage regulated amplifiers, particularly of the pulse type.

It is accordingly an object of the present invention to provide an improved voltage regulation circuit.

Another object of the present invention resides in the provision of an improved voltage regulated amplifier utilizing a driver stage wherein the required output power of the driver stage may be reduced appreciably.

Still another object of the present invention resides in the provision of an improved voltage regulated amplifier wherein power dissipation or loss in the output stages of the amplifier is reduced.

Another object of the present invention resides in the provision of a voltage regulated amplifier having lower output impedance and better regulation than analogous amplifiers suggested heretofore.

A still further object of the present invention resides in the provision of improved single-ended and push-pull amplifiers having a regulated output voltage.

A still further object of the present invention resides in the provision of an improved voltage regulator which has a decreased capacitive loading effect upon an amplifier stage being regulated, and in particular has decreased capacitive loading on driver stages associated with such an amplifier.

Another object of the present invention resides in the provision of improved pulse type amplifiers and squarewave generators having regulated outputs wherein the regulation is accomplished with higher operating efficiency than has been the case heretofore.

In providing for the foregoing objects and advantages as well as for other objects and advantages which will become apparent from the following description, the present invention contemplates the provision of a voltage regulator taking the form of a unilaterally conductive element having a control grid or control electrode, e.g., a triode, or multi-grid vacuum tube, a transistor, etc., said unilaterally conductive element being connected preferably between the output and the control electrode of an amplifier output stage. The grid or control electrode of the voltage regulating element is coupled to a source of reference potential having a magnitude approximately equal to the desired lower limit of potential swing to be produced at the output electrode of the amplifier output stage whereby the regulating element is normally nonconductive.

The overall arrangement further includes means for driving the control electrode of the output stage whereby application of driving pulses, particularly square-wave driving pulses, to the output stage, causes the output electrode or anode of the output stage to fall in potential. Once a desired and predetermined lower limit in this potential swing is reached, the regulator element becomes conductive thereby imposing a strong negative feedback between the anode or output electrode of the output stage and the control grid or control electrode of the output stage. This negative feedback, in turn, drives down the control electrode of the output stage thereby to prevent the output voltage of the overall system from falling further. The arrangement thus serves to regulate, within fairly precise limits, the voltage swing present at the amplifier output and, by provision of the control grid or control electrode in the regulating element, accomplishes this desired regulation more efficiently than has been the case heretofore.

The foregoing objects, advantages, construction and operation of the present invention will become more readily apparent form the following description and accompanying drawings, in which.

Figure 1:
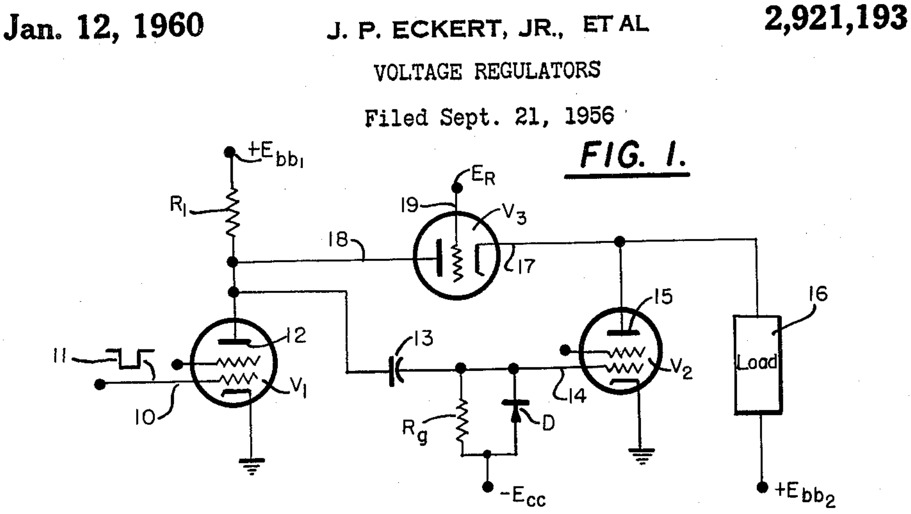
Figure 1 is a schematic of a single-ended voltage regulated amplifier constructed in accordance with the present invention.

Referring now to Figure 1, it will be seen that, in accordance with the present invention, a pulse type amplifier (illustrated as a single-ended amplifier) may comprise a driver stage V1 having a grid 10, to which may be applied for instance, a square voltage pulse 11, and the output electrode or anode 12 of the driver stage V1 which is coupled via capacitor 13 to the control electrode 14 of a power or output stage V2. The output electrode or anode 15 of stage V2 may be coupled via a load 16 to a source of supply potential +E*bb*2; and similarly, the anode or output electrode 12 of stage V1 may be coupled via an impedance or resistance R1 to a source +E*bb*1. The grid or control electrode 14 of stage V2 is clamped at a potential —E*cc* by the voltage clamp or D.C. restorer circuit comprising resistor R*g* and diode D connected as illustrated.

The arrangement thus far described may be considered to operate as a conventional pulse type amplifier; and (disregarding stage V3 to be described), it will be appreciated that the application of the voltage pulse 11 at the grid or control electrode 10 of stage V1 will effect an inverted voltage pulse of substantially the same waveform at the output electrode or anode 12 of said stage V1. This inverted pulse is coupled via capacitor 13 to the control electrode or grid 14 of stage V2. Theoretically, therefore, the electrode 14 of stage V2 will experience a drive voltage excursion of square-wave form varying between the potentials —E*cc* (which cuts stage V2 off) and some voltage positive relative thereto at which potential stage V2 conducts fairly heavily. The actual voltage appearing on the grid or control electrode 14 of stage V2 varies with variations in input signal 11 as well as with characteristics of stage V1 and supply voltage E*bb*1; and if the load 16 should also vary, the output voltage regulation of the overall amplifier becomes relatively poor.

In order to obviate this undesired result and to regulate the output voltage appearing at the anode or output electrode 15 of stage V2, a voltage regulator, illustrated in Figure 1 as a grid controlled vacuum tube V3, is inserted between the electrodes 15 and 14 of stage V2; and in particular, the cathode 17 of V3 is coupled to the anode 15 of V2 while the anode 18 of V3 is coupled via capacitor 13 to the grid 14 of said stage V2. The control grid 19 of stage V3 is coupled to a reference source of D.C. voltage ER, which reference voltage is adjusted to a magnitude approximately equalling that desired as a lower limit of plate swing at stage V2. By this arrangement, therefore, once the potential at the output electrode or anode 15 of V2 falls below the desired and predetermined regulating potential, V3 commences conduction thereby imposing strong negative feedback via capacitor 13 onto the grid or control electrode 14 of stage V2. In practice, the lower the plate of V2 tends to drop, the more the grid or control electrode 14 of stage V2 is driven down, whereby the overall arrangement regulates the lower limit of plate swing to some value near the reference potential ER with the exact regulation value depending upon the characteristics of the stages V2 and V3.

It should be noted in passing that the anode 18 of stage V3 is also coupled to the source +E*bb*1 via the aforementioned resistor R1 whereby resistor R1 acts as the plate load for both stages V1 and V3 on alternate half cycles of the input signal 11. It should further be noted that grid 19 of stage V3 shields anode 18 from cathode 17, whereby provision of the grid 19 appreciably reduces the capacitance between anode 15 and grid 14 in the output stage V2. This latter shielding characteristic appreciably reduces the power dissipation in output stage V2, lowers the required output power of driver stage V1, and in fact results in better regulation at load 16.

Figures 2A, 2B, 2C:
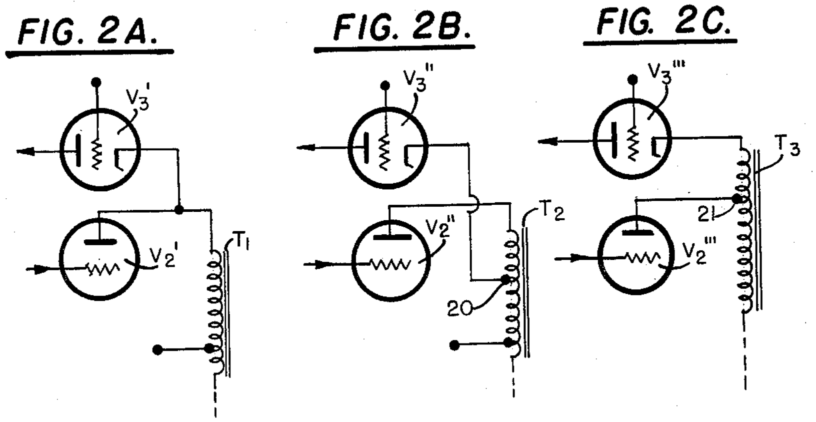
Figures 2A, 2B and 2C illustrate possible alternative schematic connections which may be employed in the circuits of Figures 1 and 3.

In the particular arrangement thus far discussed in Figure 1, the load 16 has been illustrated as direct-coupled to the anode 15 of stage V2. Other coupling arrangements may, of course, be employed; and in particular, Figure 2A illustrates, in partial schematic, an arrangement wherein the output electrode of output stage V2′ may be coupled to a load, for instance via an output transformer T1. In the particular arrangement of Figure 2A, the cathode of regulator tube V3′ is, as was the case in Figure 1, coupled directly to the anode of output stage V2′.

Inasmuch as the regulator stage V3′ has gain, the cathode of the regulator stage may in fact be coupled to a tap on the output transformer. This type of an arrangement is illustrated in Figure 2B. In particular, it will be noted that the anode of output stage V2″ is, as before, coupled to an output transformer T2, while the cathode of regulator V3″ is coupled to a tap 20 on a winding of transformer T2. The arrangement of Figure 2B effects the desired regulation when the potential at tap 20 falls to substantially the reference potential imposed on the grid of stage V3″. Though the regulation effected by the arrangement of Figure 2B is not quite as close as that produced by Figures 1, 2A (or 2C to be described), the circuit of Figure 2B does have the distinct advantages that capacitive loading between the anode and ground, for instance, of output stage V2″ is reduced even further; and in addition, the voltage applied between the heater and cathode of the regulator stage V3″ is also reduced.

As has been mentioned previously, the arrangements of Figures 1 and 2A, wherein the cathode of regulator stages such as V3 and V3′ are coupled directly to the anode of output stages such as V2 and V2′, effect somewhat closer regulation than is accomplished by the tapped arrangement of Figure 2B. In low speed circuits even closer regulation may be effected by tying the cathode of the regulator tube or stage to an extension of the output winding. This latter arrangement is illustrated in Figure 2C, wherein the anode of output stage V2‴ is illustrated as coupled to a tap 21 on a winding of output transformer T3, and the cathode of regulator tube V3‴ is coupled, as illustrated, to the upper end of the output winding.

Figure 3:
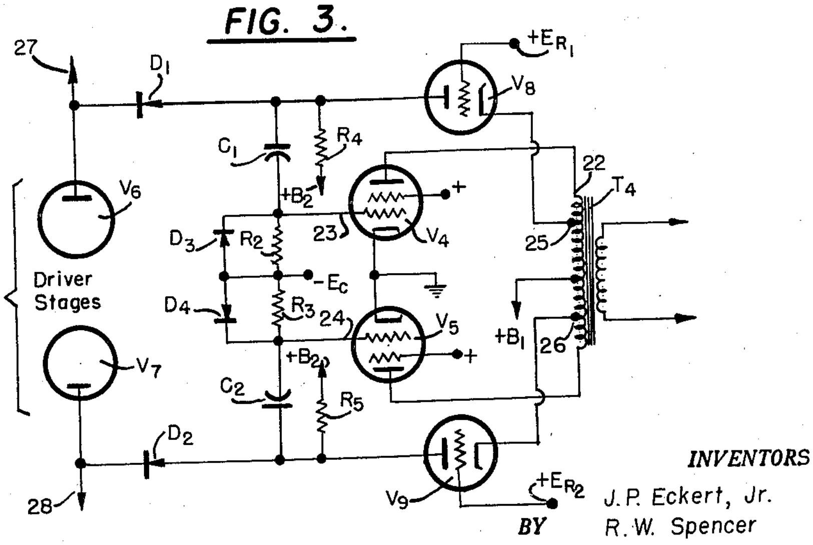
Figure 3 illustrates a preferred embodiment of the present invention comprising a push-pull voltage regulated pulse type amplifier such as may be employed for instance in square-wave generators.

The arrangements thus far described in reference to Figures 1 and 2 have comprised voltage regulated amplifiers of the single-ended type. The concepts of the present invention find particular utility, however, in effecting output voltage regulation of push-pull amplifiers, such as may be employed, for instance, in square-wave generators; and a preferred embodiment of the invention in this respect is illustrated in Figure 3. It will be noted that the circuit of Figure 3 comprises a pair of output tubes V4 and V5 connected in push-pull; and in particular, the cathodes of the stages V4 and V5 are coupled together to a point of ground potential, while the anodes of the stages V4 and V5 are coupled to opposing ends of a winding 22 on transformer T4, which winding 22 has a center tap coupled to supply voltage +B1 thereby to provide energization for the output stages V4 and V5. A pair of driver stages V6 and V7 are also provided with the anodes of the driver stages being coupled via diodes D1 and D2 and capacitors C1 and C2, respectively, to the control grids 23 and 24 of stages V4 and V5. Each of the control grids 23 and 24 is, as was the case in Figure 1, lower clamped at a potential —E*c* by the clamping arrangements comprising diodes D3 and D4 and resistors R2 and R3.

Voltage regulation is accomplished in the arrangement of Figure 3 through the provision of a pair of voltage regulator tubes V8 and V9 which have their anodes coupled via capacitors C1 and C2 to the grids 23 and 24 respectively of stages V4 and V5; have their control grids coupled to sources of reference potential +ER1 and +ER2; and have their cathode coupled to tap points 25 and 26 on output winding 22. The reference sources +ER1 and +ER2 may have the same or different voltage magnitudes.

The operation of the circuit thus illustrated in Figure 3 is analogous to the discussion already given with respect to Figure 1, and in particular the tubes V8 and V9 are normally non-conductive and tend to conduct, for regulation purposes, when the potential at taps 25 and 26 respectively drop substantially to the reference potentials +ER1 and +ER2, respectively. In the arrangement of Figure 3, separate loads are employed for the regulator stages, such as V8 and V9, and for the driver stages, such as V6 and V7. In particular, it will be noted that the anodes of stages V8 and V9 are coupled respectively to supply sources +B2 via plate loads R4 and R5. The anodes of driver stages V6 and V7 may be coupled via similar plate loads to sources of supply at points 27 and 28. For the particular arrangement of Figure 3, the diodes D1 and D2 serve to isolate the plate loads of the driver stages and regulating stages from one another thereby to even further reduce the capacitive loading on the anodes of the regulator stages V8 and V9.

While the arrangements of Figures 1 and 3 have been illustrated as utilizing triodes for regulation purposes, it will be appreciated that, in practice, a beam power tube or a pentode may be more desirable than a triode for regulation purposes because of the lower cut-off voltages, higher transconductance, and lower plate to cathode capacitance commonly available in these latter tubes. In actual practice, when a triode is employed, the output impedance at the output plate of the regulator may be calculated and is found to be, referring to the symbols of Figure 1, as follows:

$$R_0=\frac{r_{p2}(r_{p3}+R_1)}{r_{p3}+R_1+r_{p2}(1+\mu_3)(nR_1g_{m2}+1)}$$

where:

$R_1$ is the plate load resistor for tube V3 (which may also be used by tube V1 on the other half cycle)

$n$ is the fraction of output plate voltage applied to the feedback cathode [for direct connection (Figures 1 and 2A) $n=1$; for tapped transformer $n<1$]

$r_{p2}$, $r_{p3}$ are plate resistances of tubes V2, V3 at operating points which obtain during regulation $g_{m2}$ is the transconductance of V2 during regulation, and $\mu_3$ is amplification factor of tube V3 during regulation The equation is exact only if grid current is negligible in the regulator tube. The equation holds also for beam power tubes and pentodes if the grid current and screen current are negligible.

While we have thus described a preferred embodiment of the present invention, many variations will be suggested to those skilled in the art, and certain such variations have been suggested above. It must accordingly be stressed that the foregoing description is meant to be illustrative only and should not be considered limitative of our invention, and all such variations and modifications as are in accord with the principles described are meant to fall within the scope of the appended claims.

Having thus described our invention, we claim:

1. A voltage regulated amplifier circuit for pulse signals comprising, the combination of an input stage, an output stage, said output stage comprising a first vacuum tube including a plurality of electrodes comprising an anode, a cathode, and a control grid, bias means coupled to said control grid of said output stage for rendering said output stage normally non-conducting, said input stage being coupled to said control grid of said output stage such that said input stage is operable to supply pulse signals to said output stage and said output stage is rendered conductive in response thereto whereby the voltage at said anode of said output stage changes in accordance with the pulse signals supplied by said input stage, said output load means being coupled to said anode of said output stage, and a voltage regulating stage, said regulating stage comprising a second vacuum tube including a plurality of electrodes comprising an anode, a cathode and a control grid, a constant reference potential source coupled to said control grid of said regulating stage, said potential source having a predetermined value such that said regulating stage is normally non-conductive, said cathode of said regulating stage being coupled to said anode of said output stage such that said regulating stage is rendered conductive in response to a potential greater than a predetermined value being applied to said cathode of said vacuum tube of said regulating stage by said anode of said output stage whereby said regulating stage effects a degenerative type of feedback so that the potential supplied to said load means is substantially constant during said pulses.

2. The combination of claim 1 wherein said input stage includes means producing a substantially square-wave driving pulse.

3. In combination, a control circuit comprising a first vacuum tube having an anode, a cathode and a control grid, output load means, said load means comprising a transformer coupled to the anode of said first vacuum tube, drive means coupled to said grid, and voltage regulator means for limiting potential excursions of said anode upon application of drive pulses to said grid comprising a second grid controlled vacuum tube coupled between the anode and grid of said first vacuum tube, the cathode of said second vacuum tube being coupled to the anode of said first vacuum tube via a tap on one winding of said transformer, and a source of substantially steady-state reference potential coupled to the grid of said vacuum tube, said reference potential being so chosen that said second vacuum tube is normally non-conductive, said second vacuum tube being rendered conductive when the anode of said first tube assumes, in the course of said potential excursions, a predetermined potential related to said reference potential whereby said second tube conducts to effect feedback between said anode and control grid of said first tube thereby to prevent the anode potential of said first tube from exceeding said predetermined potential.

4. In combination, an amplifier comprising a square-wave pulse type drive stage and an output stage connected in cascade, said output stage comprising a device having an output electrode and a control electrode, means coupling said control electrode of said output stage to said drive stage including means for biasing said output stage to be normally cut-off, said coupling means further including means for applying said square-wave pulses to said output stage to thereby render said output stage conductive, load means coupled to said output electrode of said output stage, voltage regulator means for limiting potential excursions at said load means said regulator means comprising a unilaterally conductive element having at least three electrodes including a control electrode and an output electrode, said element being connected between the output and control electrodes of said output stage with the third one of said three electrodes of said unilaterally conductive element being coupled to said output electrode of said output stage, means for applying a certain potential to said third electrode to bias said unilaterally conductive element to be cut-off, and a source of reference potential coupled to the control electrode of said unilaterally conductive element, said reference potential source having a predetermined magnitude such that said unilaterally conductive element becomes conductive when the potential at said output stage output electrode falls below a certain magnitude, said output electrode of said unilaterally conductive element being connected in inverse feedback relation to said output stage control electrode.

5. In combination, an amplifier comprising first and second unilaterally conductive elements connected in push-pull, each of said elements having a control electrode, separate drive means coupled to said control electrodes of said first and second elements, transformer means having opposite ends of a first winding coupled to separate ones of the output electrodes of said first and second elements, load means inductively coupled to said output electrodes by said transformer means, and voltage regulator means comprising third and fourth unilaterally conductive elements each of which has a control electrode, means connecting said third and fourth elements between the control electrodes of said first and second elements and separate spaced tap points on said first transformer winding, and a source of reference potential coupled to the control electrodes of said third and fourth elements.

6. A pulse type amplifier comprising first and second grid controlled vacuum tubes connected in push-pull, biasing means being coupled to the control grids of said first and second tubes, said biasing means operative to clamp said control grids at a certain voltage in the absence of an input pulse whereby said first and second tubes are normally non-conductive, pulse type drive means coupled to said control grids of said first and second tubes such that said first and second tubes are rendered conductive when a pulse is supplied to said control grids, and voltage regulator means comprising third and fourth grid-controlled vacuum tubes, said third and fourth tubes biased to be normally non-conductive, the cathodes of said third and fourth tubes being coupled to the anodes of said first and second tubes so that the potential at said cathodes of said third and fourth tubes varies as the potential at the anodes of said first and second tubes, the anodes of said third and fourth tubes being coupled to the control grids of said first and second tubes so that pulses are fed back to said first and second tubes when said third and fourth tubes are rendered conductive due to the potenial at said anodes of said first and second tubes falling below a predetermined value, and reference potential means coupled to the control grids of said third and fourth tubes for supplying a predetermined substantially constant potential to said control grids of said third and fourth tubes, said reference means defining said predetermined potential value below which said anodes of said first and second tubes may not fall in order that said third and fourth tubes remain non-conductive.

7. The combination of claim 6 wherein said drive means is coupled to the control grids of said first and second tubes via unilateral impedance means.

8. A pulse type amplifier comprising an amplifier tube having at least an anode, a cathode, and a grid, means for clamping said grid to a reference potential such that said amplifier tube is normally cut-off, means for driving said grid so that said amplifier tube is rendered conductive thereby to effect a voltage excursion at said anode, and means for limiting at least one polarity of said voltage excursion to a predetermined magnitude comprising a unilaterally conductive element, having at least a control electrode, said element being coupled between said anode and said grid so that current flows from said anode to said grid when said element is rendered conductive, and a source of reference potential, having a magnitude substantially equal to said predetermined magnitude, said source being coupled to the control electrode of said element, said reference potential being selected to render said unilaterally conductive element normally non-conductive, said unilaterally conductive element being rendered conductive when the anode of said amplifier tube reaches said predetermined magnitude in the course of said voltage excursion whereby said element is selectively operative to prevent the potential of said amplifier tube anode from exceeding said predetermined magnitude.

References Cited in the file of this patent

UNITED STATES PATENTS

| | | |
|---|---|---|
| 2,204,089 | Landon | June 11, 1940 |
| 2,307,308 | Sorensen | Jan. 5, 1943 |
| 2,510,683 | Carpentier | June 6, 1950 |
| 2,560,709 | Woodward | July 17, 1951 |
| 2,652,490 | Levy | Sept. 15, 1953 |
| 2,670,409 | Cooper | Feb. 23, 1954 |
| 2,692,919 | Cohen | Oct. 26, 1954 |
| 2,737,547 | Deming | Mar. 6, 1956 |
| 2,748,269 | Slutz | May 29, 1956 |
| 2,810,025 | Clements | Oct. 15, 1957 |